United States Patent [19]

Helbert et al.

[11] 4,304,840

[45] Dec. 8, 1981

[54] METHOD OF DELINEATING A DESIRED INTEGRATED CIRCUIT PATTERN UPON A CIRCUIT SUBSTRATE

[75] Inventors: John N. Helbert, Eatontown, N.J.; Charles U. Pittman, Jr., University, Ala.

[73] Assignee: The United States of America as represented by the Secretary of the Army, Washington, D.C.

[21] Appl. No.: 152,261

[22] Filed: May 22, 1980

[51] Int. Cl.$^3$ .............................................. G03C 5/00
[52] U.S. Cl. .................................. 430/270; 430/272; 430/281; 430/296; 430/942; 430/967
[58] Field of Search ............... 430/270, 281, 285, 296, 430/313, 323, 324, 325, 942, 967, 272; 156/643

[56] References Cited

PUBLICATIONS

Lai et al., *Journal of Vacuum Sci. Technology*, Nov./Dec. 1979, pp. 1992–1995.

*Primary Examiner*—J. Travis Brown
*Attorney, Agent, or Firm*—Nathan Edelberg; Jeremiah G. Murray; Roy E. Gordon

[57] ABSTRACT

A method is disclosed of delineating a desired integrated circuit pattern upon a circuit substrate. According to the method, the copolymer poly(methyl alpha-chloroacrylate-co-methacrylonitrile) is formed by emulsion polymerization techniques. The copolymer is then dissolved in a spinning solvent that will dissolve the copolymer and form a viscous solution. The solution is applied to the surface of the substrate and the substrate spinned to form a smooth, uniform resist film of about 0.3 to 1.0 micron in thickness. The resist film is heated and the region of the resist film to be patterned then exposed to ionizing radiation until exposures greater than $1.5 \times 10^{-5}$ C/cm$^2$ are obtained. The exposed regions of the resist are then developed to the substrate.

9 Claims, No Drawings

METHOD OF DELINEATING A DESIRED INTEGRATED CIRCUIT PATTERN UPON A CIRCUIT SUBSTRATE

The invention described herein may be manufactured, used, and licensed by or for the Government for governmental purposes without the payment to us of any royalty thereon.

This invention relates in general to a method of patterning a substrate and in particular, to a method of delineating a desired integrated circuit-pattern upon a circuit substrate. This application is copending with U.S. patent application Ser. No. 051,263, filed June 22, 1979, now U.S. Pat. No. 4,233,394, by J. N. Helbert for "Method of Patterning A Substrate" and assigned to a common assignee.

BACKGROUND OF THE INVENTION

Electron-beam lithography (EBL) is an integrated circuit production technique which utilizes a polymer resist to delineate circuit patterns for monolithic circuits. Where the e-beam is impinged upon the resist coated circuit substrate, the e-beam resist either degrades or crosslinks depending upon the intrinsic nature of the resist. If the polymer degrades, it is a positive acting e-beam resist. If it crosslinks, it is a negative acting resist. By using the e-beam resist it is possible to pattern the desired circuit pattern upon the circuit substrate as for example, a silicon wafer with an oxide top layer.

Poly(methyl methacrylate) (PMMA) is the state-of-the-art positive e-beam resist material. It is capable of high resolution but is not sensitive enough for commercial device production using direct-write e-beam lithography. The e-beam sensitivity of PMMA is $2 \times 10^{-4}$ (20 keV) or $5.6 \times 10^{-5}$ (10 keV) Coulombs per cm$^2$, while sensitivities in the $10^{-5}$–$10^{-6}$ range are desirable for EBL production; resolution, however, cannot be sacrificed for sensitivity. Resolution is stipulated by the minimum obtainable linewidth and line space for the resist. In this connection, PMMA is capable of resolving 1 micron lines and spaces.

In Ser. No. 051,263, there is disclosed and claimed a method of patterning a substrate in which the positive acting e-beam resist is characterized by increased sensitivity without a sacrifice in resolution. That result is obtained by using poly(methyacrylonitrile) (PMCN) as the positive action e-beam resist.

SUMMARY OF THE INVENTION

The general object of this invention is to provide a method of delineating a desired integrated circuit pattern upon a circuit substrate. A more specific object of the invention is to provide such a method in which the resist sensitivity is improved without a sacrifice in resolution.

The foregoing objects have now been attained by (EBL) using poly(methyl alpha-chloroacrylate-co-methacrylonitrile) (MCA/MCN) copolymers as a positive action e-beam resist. More particularly, according to the invention, (MCA/MCN) copolymers are prepared by emulsion polymerization techniques. The copolymer is then dissolved in a spinning solvent that will dissolve the copolymer and form a viscous solution. The solution is then applied to the surface of the substrate spinned to form a smooth, uniform resist film of at least 3,000 angstroms in thickness. The resist film is heated and the region of the resist film to be patterned then exposed to ionizing radiation until exposures greater than $1.5 \times 10^{-5}$ (10 keV) C/cm$^2$ are obtained. The exposed regions of the resist are then developed to the substrate.

DESCRIPTION OF THE PREFERRED EMBODIMENT

A 1:1 MCA/MCN copolymer is prepared in the following manner. An aqueous stock solution of $5 \times 10^{-2}$ gram of potassium persulfate, 0.4 gram of sodium lauryl sulfate and 100 grams of distilled water is premixed. Then, a mixture of 23 grams of methyl alpha-chloroacrylate and 27 grams of methacrylonitrile is added and the reaction heated at 50 degrees with vigorous magnetic stirring for 14 hours under a slow continuous nitrogen purge. The resulting copolymer latex is coagulated by pouring into rapidly stirring methanol.

A viscous solution of 1:1 MCA/MCN copolymer is prepared by dissolving the powder into nitromethane. The resulting solution is filtered to 0.6 micron by standard membrane filtering techniques and the filtrate applied to a silicon substrate having an oxide coating of about 0.3 micron. The substrate is spinned using conventional spinning equipment to obtain films ranging from 0.30 to 0.70 micron for spinning frequencies ranging from 4 to $1 \times 10^3$ rpm. After spinning, the resist film is heated in-vacuo at 130–160 degrees C. for 30 minutes. The resist film on the substrate to be patterned is then exposed to an electron beam test pattern generated by a flying spot scan-controlled electron beam machine operating at 10 keV until exposures greater than $1.5 \times 10^{-5}$ C/cm$^2$ (10 keV) are obtained. The exposed resist regions of an 0.34 micron thick film are then selectively removed to the substrate by a 27 sec. dip development in 4:1 mixture of benzonitrile and toluene. No loss in the unexposed resist area occurs during development. The exposed area of the resist is 3.7 times more sensitive than PMMA while maintaining line edge wall profile verticality. In addition, the 1:1 MCA/MCN copolymer has a 2.5 times better plasma (CF$_4$/O$_2$) etch resistance than PMMA, whose resistance is marginal.

EXAMPLE 2

A 2.3:1 MCA/MCN copolymer is prepared as described in the preferred embodiment except that the monomer charges are changed to 24.5 grams of methyl-alpha chloracrylate and 25.5 grams of methacrylonitrile. The resulting 2.3:1 copolymer is dissolved into nitromethane to yield a 2.0 w/v% solution. This solution is applied to a silicon substrate coated with an oxide layer of 0.3 micron in thickness and spinned at frequencies of 700 to 4000 rpm to yield resist films ranging from 0.28–1.0 micron. After spinning, the resist film is heated in-vacuo at 130–160 degrees C. for 30 minutes. The resist film on the substrate to be patterned is then exposed to an electron beam test pattern generated by a flying spot scan-controlled electron beam machine operating at 20 keV until exposures greater than $7 \times 10^{-5}$ C/cm$^2$ (20 keV) are obtained. The exposed resist images in the 0.70 micron thick resist film are then selectively removed to the substrate by a 5 min. dip development in benzonitrile. No measurable loss in the exposed resist area occurs during development at this dose.

The spinning solvent for the MCA/MCN copolymer must dissolve a high enough concentration of copolymer to result in a viscous solution that can be applied as a smooth uniform resist film of about 0.3 to 1.0 micron in thickness. The use of nitromethane as the spinning solvent is preferred. Films ranging from 0.28 micron to 1.0 micron can be cast using 2 to 3 percent solutions of MCA/MCN copolymer in nitromethane. A particularly desirable range of spinning frequencies is 4000 to 1000 rpm. As the substrate, one can use any material on which circuit patterns are delineated. Substrate materials that can be used include silicon wafers with a 0.3 micron thick conventionally grown oxide.

After the resist film has been applied to the susbstrate, the resist film may be heated to improve the adhesion of the resist to the substrate. The region of the resist film to be patterned is then exposed to ionizing radiation, as for example to an electron beam test pattern generated by a flying spot scan-controlled electron beam operating at 10 to 20 keV until exposures greater than the sensitivity exposure are obtained. The ionizing radiation may also be x-ray.

After the irradiation, the exposed region of the resist is developed to the substrate. In this connection, the most critical item in developing a resist process for e-beam lithography is the resist developer. Even if good images are exposed into the resist, a poor developer can seriously degrade the resolution performance of the resist beyond the toleration limits. Benzonitrile and the 4:1 benzonitrile/toluene mixture yield usable images in the copolymer resist.

In the method of the invention, the copolymer resists function with the same resolution as PMMA and PMCN but with greater sensitivity. Hence, lower IC production costs are achieved when the copolymers are used as direct write e-beam positive resists. The copolymers also serve as plasma-etching masks, as well or better than PMMA.

We wish it to be understood that we do not desire to be limited to the exact details as described for obvious modifications will occur to a person skilled in the art.

What is claimed is:

1. Method of delineating a desired integrated circuit pattern upon a circuit substrate, said method including the steps of:
    (A) forming the copolymer poly(methyl alpha-chloroacrylate-co-methyacrylonitrile) by emulsion polymerization techniques and in the mole ratio of about 1 mole methyl alpha-chloroacrylate to about 1 mole methacrylonitrile,
    (B) dissolving the copolymer in a spinning solvent that will dissolve the copolymer and form a viscous solution,
    (C) applying the solution to the surface of the substrate and spinning the substrate to form a smooth, uniform resist film of about 0.3 to 1.0 micron in thickness,
    (D) heating the resist film,
    (E) exposing the region of the resist film to be patterned to ionizing radiation until exposures greater than $1.5 \times 10^{-5}$ (10 keV) C/cm$^2$ are obtained, and
    (F) developing the exposed regions of the resist to the substrate in a 4 to 1 mixture of benzonitrile and toluene.

2. Method according to claim 1 wherein the copolymer is formed by premixing about $5 \times 10^{-2}$ gram of potassium persulfate, about 0.4 gram of sodium lauryl sulfate and 100 grams of distilled water, adding a mixture of about 23 grams of methyl alpha-chloroacrylate and about 27 grams of methacrylonitrile thereto, heating the reaction at 50 degrees with vigorous magnetic stirring for about 14 hours under a slow continuous nitrogen purge, and coagulating the resulting copolymer latex by pouring into rapidly stirring methanol.

3. Method according to claim 1 wherein the substrate is a silicon wafer having an oxide surface layer of about 0.3 micron in thickness.

4. Method according to claim 1 wherein the spinning solvent is nitromethane.

5. Method according to claim 1 wherein a smooth, uniform resist film of about 0.28 to 1.0 micron in thickness is formed on the substrate.

6. Method according to claim 1 wherein the ionizing radiation is selected from the group consisting of electron beam and x-ray.

7. Method according to claim 6 wherein the ionizing radiation is electron beam.

8. Method according to claim 6 wherein the ionizing radiation is x-ray.

9. Method of delineating a desired integrated circuit pattern upon a circuit substrate, said method consisting of: premixing about $5 \times 10^{-2}$ gram of potassium persulfate, about 0.4 gram of sodium lauryl sulfate and about 100 grams of distilled water, adding a mixture of about 23 grams of methyl alpha-chloroacrylate and about 27 grams of methacrylonitrile thereto, heating the reaction at 50 degrees with vigorous magnetic stirring for about 14 hours under a slow continuous nitrogen purge, coagulating the resulting copolymer latex from methanol, dissolving the powder in nitromethane to form a viscous solution and applying the solution to an oxidized silicon substrate in which the thickness of the oxide layer is about 0.3 micron, spinning the substrate to form a smooth, uniform resist film of about 0.3 to 1.0 micron in thickness, heating the resist film in-vacuo at about 130–160 degrees C. for about 30 minutes, exposing the resist film on the substrate to be patterned to an electron beam test pattern generated by a flying spot scan-controlled electron beam machine operating at 10 keV until exposures greater than $1.5 \times 10^{-5}$ C/cm$^2$ are obtained, and selectively removing the exposed resist regions of the film to the substrate by an 27 second spray development in a 4:1 mixture of benzonitrile and toluene.

* * * * *